(12) United States Patent
Fukuzawa

(10) Patent No.: US 10,224,904 B2
(45) Date of Patent: Mar. 5, 2019

(54) OSCILLATOR, ELECTRONIC APPARATUS, AND MOVING OBJECT

(71) Applicant: Seiko Epson Corporation, Tokyo (JP)

(72) Inventor: Akihiro Fukuzawa, Hino (JP)

(73) Assignee: Seiko Epson Corporation (JP)

( * ) Notice: Subject to any disclaimer, the term of this patent is extended or adjusted under 35 U.S.C. 154(b) by 212 days.

(21) Appl. No.: 15/286,920

(22) Filed: Oct. 6, 2016

(65) Prior Publication Data

US 2017/0104473 A1    Apr. 13, 2017

(30) Foreign Application Priority Data

Oct. 8, 2015 (JP) ................................ 2015-199983

(51) Int. Cl.
 *H03B 5/36* (2006.01)
 *H03H 9/05* (2006.01)
 *H03H 9/19* (2006.01)
 *H03K 3/013* (2006.01)

(52) U.S. Cl.
CPC ............ *H03K 3/013* (2013.01); *H03B 5/362* (2013.01); *H03B 5/368* (2013.01); *H03H 9/0552* (2013.01); *H03H 9/19* (2013.01)

(58) Field of Classification Search
CPC .................................. H03H 9/19; H03K 3/013
See application file for complete search history.

(56) References Cited

U.S. PATENT DOCUMENTS

| 6,229,249 B1 * | 5/2001 | Hatanaka | H03B 5/04 310/348 |
| 8,736,390 B2 | 5/2014 | Ozawa et al. | |
| 9,300,248 B2 | 3/2016 | Ozawa et al. | |
| 2007/0126519 A1 * | 6/2007 | Mizumura | H03H 9/0552 331/158 |
| 2015/0116052 A1 * | 4/2015 | Kikushima | H03H 9/0552 331/158 |

FOREIGN PATENT DOCUMENTS

JP         2012-186784 A      9/2012

* cited by examiner

*Primary Examiner* — Jeffrey M Shin
(74) *Attorney, Agent, or Firm* — Harness, Dickey & Pierce, P.L.C.

(57) ABSTRACT

A oscillator includes a substrate having a first surface and a second surface, a first wiring layer and a second wiring layer disposed respectively on the first and second surfaces, and a plurality of through holes electrically connecting the first and second wiring layers to each other, a resonator disposed above the first surface of the substrate, and having a resonator element, a pair of electrodes sandwiching the resonator element, and a pair of terminals adapted to electrically connect the pair of electrodes to the first electrode layer, and at least one semiconductor device disposed on the second surface of the substrate, adapted to generate an oscillation signal, and having first and second terminals electrically connected respectively to the pair of terminals of the resonator via the second wiring layer and the first wiring layer, and a third terminal supplied with a digital control signal, wherein a distance between each of the first and second terminals and the pair of terminals of the resonator is shorter than a distance between the third terminal and the pair of terminals of the resonator.

9 Claims, 6 Drawing Sheets

OSCILLATOR, ELECTRONIC APPARATUS, AND MOVING OBJECT

BACKGROUND

1. Technical Field

The invention relates to an oscillator configured by mounting a resonator and a semiconductor device on a substrate. Further, the invention relates to an electronic apparatus, a moving object, and so on using such an oscillator.

2. Related Art

For example, in some cases, a quartz crystal oscillator is configured by mounting a quartz crystal resonator and a semiconductor device (IC) on a substrate. In such a quartz crystal oscillator, in some cases, the characteristic of the quartz crystal resonator is improved by overdriving the quartz crystal resonator, or the quartz crystal resonator is connected to an external measurement device to check the characteristic using two monitor terminals connected to the quartz crystal resonator prior to mounting the IC. Therefore, in general, the wiring pattern connecting the quartz crystal resonator and the monitor terminals is elongated, and becomes easy to be affected by an external noise such as a noise from a digital circuit. As a result, there is a problem that the oscillation frequency is shifted from a preset value, or a phase distortion is generated.

As a related-art technology, in JP-A-2012-186784 (paragraphs 0021-0022, FIG. 1) (Document 1), there is disclosed a quartz crystal oscillation device having a semiconductor package and a quartz crystal resonator mounted on a wiring board. The semiconductor package is provided with a first external terminal and a second external terminal used for connecting the quartz crystal resonator. On the wiring board, there are formed a first wiring pattern extending from the first external terminal and connected to one end of the quartz crystal resonator, and a second wiring pattern extending from the second external terminal in roughly the same direction as the first wiring pattern and connected to the other end of the quartz crystal resonator.

Further, on the wiring board, there is formed a third wiring pattern disposed in an area between the first wiring pattern and the second wiring pattern, and electrically connected to a ground power supply voltage. Thus, it becomes possible to reduce the pin-to-pin parasitic capacitance between the first external terminal and the second external terminal, and to reduce the pin-to-pin coupling noise. As a result, it is possible to satisfy the requirement of reduction of the parasitic capacitance and improvement of noise immunity.

However, in Document 1, the first wiring pattern and the second wiring pattern for connecting the quartz crystal resonator and the first and second external terminals extend in roughly the same direction to be elongated, and at the same time, the third wiring pattern connected electrically to the ground power supply voltage is formed between the first and second wiring patterns. Therefore, since the parasitic capacitance between the quartz crystal resonator and the ground wiring pattern increases, and the variable range of the oscillation frequency is narrowed due to the influence thereof, the characteristic of the oscillator is limited.

Further, Document 1 discloses the improvement of the noise immunity of the first external terminal and the second external terminal to be connected to the quartz crystal resonator, but does not particularly disclose the improvement of the noise immunity of other terminals.

SUMMARY

A first advantage of some aspects of the invention is to provide an oscillator in which the influence of the exogenous noise such as a noise from a digital circuit on the oscillation action is reduced without narrowing the variable range of the oscillation frequency. A second advantage of some aspects of the invention is to provide an electronic apparatus and a moving object using such an oscillator.

An oscillator according to a first aspect of the invention includes a substrate having a first surface and a second surface opposed to each other, a first wiring layer and a second wiring layer disposed respectively on the first surface and the second surface, and a plurality of through holes electrically connecting the first wiring layer and the second wiring layer to each other, a resonator disposed above the first surface of the substrate, and having a resonator element, a pair of electrodes sandwiching the resonator element, and a pair of terminals adapted to electrically connect the pair of electrodes to the first electrode layer, and at least one semiconductor device disposed on the second surface of the substrate, adapted to perform an oscillation action to generate an oscillation signal, and having first and second terminals electrically connected respectively to the pair of terminals of the resonator via the second wiring layer and the first wiring layer, and a third terminal supplied with a digital control signal adapted to control an oscillation frequency, wherein a distance between each of the first and second terminals and the pair of terminals of the resonator is shorter than a distance between the third terminal and the pair of terminals of the resonator.

According to the first aspect of the invention, by disposing the resonator and the at least one semiconductor device respectively on the both surfaces of the substrate, and connecting the resonator and the semiconductor device to each other via the through holes, it is possible to shorten the interconnections for respectively connecting the pair of terminals of the resonator and the first and second terminals of the semiconductor device to each other to thereby reduce the parasitic capacitance of each of these interconnections. As a result, it is possible to provide the oscillator in which the influence of the exogenous noise such as a noise from a digital circuit on the oscillation action is reduced without narrowing the variable range of the oscillation frequency.

Here, it is possible that the at least one semiconductor device further includes a fourth terminal supplied with a power supply potential, and a fifth terminal supplied with a reference potential, and the substrate includes a shield pattern electrically connected to one of the fourth and fifth terminals, and disposed one of on the first surface of and inside the substrate. Thus, since the shield pattern is disposed between the resonator and the at least one semiconductor device, it is possible to further reduce the influence of the exogenous noise such as a noise from the digital circuit on the oscillation action.

It is preferable that the at least one semiconductor device further includes a sixth terminal supplied with a control voltage adapted to control the oscillation frequency, and a distance between the sixth terminal and the pair of terminals of the resonator is shorter than a distance between the third terminal and the pair of terminals of the resonator. With this configuration, since the sixth terminal supplied with the control voltage is disposed closer to the oscillation circuit than the third terminal supplied with the digital control signal, it is possible to reduce the influence of the digital control signals acting as the noise on the oscillation action.

It is preferable that the at least one semiconductor device further includes a seventh terminal adapted to output one of the oscillation signal and a clock signal generated based on the oscillation signal, and a distance between the seventh terminal and the pair of terminals of the resonator is shorter than a distance between the third terminal and the pair of terminals of the resonator. With this configuration, since the seventh terminal for outputting the oscillation signal or the clock signal is disposed closer to the oscillation circuit than the third terminal supplied with the digital control signal, it is possible to reduce the influence of the digital control signals acting as the noise on the oscillation action.

The above configuration may be configured such that the substrate, a first sidewall projecting from the first surface of the substrate in a peripheral area of the first surface of the substrate, and a second sidewall projecting from the second surface of the substrate in a peripheral area of the second surface of the substrate constitute a package having two cavities respectively housing the resonator and the at least one semiconductor device. With this configuration, it is possible for the package to safely protect the resonator and the at least one semiconductor device.

In this case, the oscillator may further include a plurality of external connection terminals disposed on a principal surface of the second sidewall, and electrically connected respectively to the terminals of the at least one semiconductor device. With this configuration, when mounting the oscillator on the printed-wiring board or the like, electrical connection of the external connection terminals becomes easy.

An electronic apparatus according to a second aspect of the invention includes any one of the oscillators described above. A moving object according to a third aspect of the invention includes any one of the oscillators described above. According to the second or third aspect of the invention, it is possible to provide the electronic apparatus or the moving object operating with the accurate clock signal generated using the oscillator in which the influence of the exogenous noise such as a noise from a digital circuit on the oscillation action is reduced without narrowing the variable range of the oscillation frequency.

BRIEF DESCRIPTION OF THE DRAWINGS

The invention will be described with reference to the accompanying drawings, wherein like numbers reference like elements.

DESCRIPTION OF EXEMPLARY EMBODIMENTS

Some embodiments of the invention will hereinafter be explained in detail with reference to the drawings. It should be noted that the same constituents are denoted by the same reference symbols, and the duplicated explanation will be omitted. In the following embodiments, as an example of the oscillator, there is described a quartz crystal oscillator using a quartz crystal resonator.

First Embodiment

Figure 1:
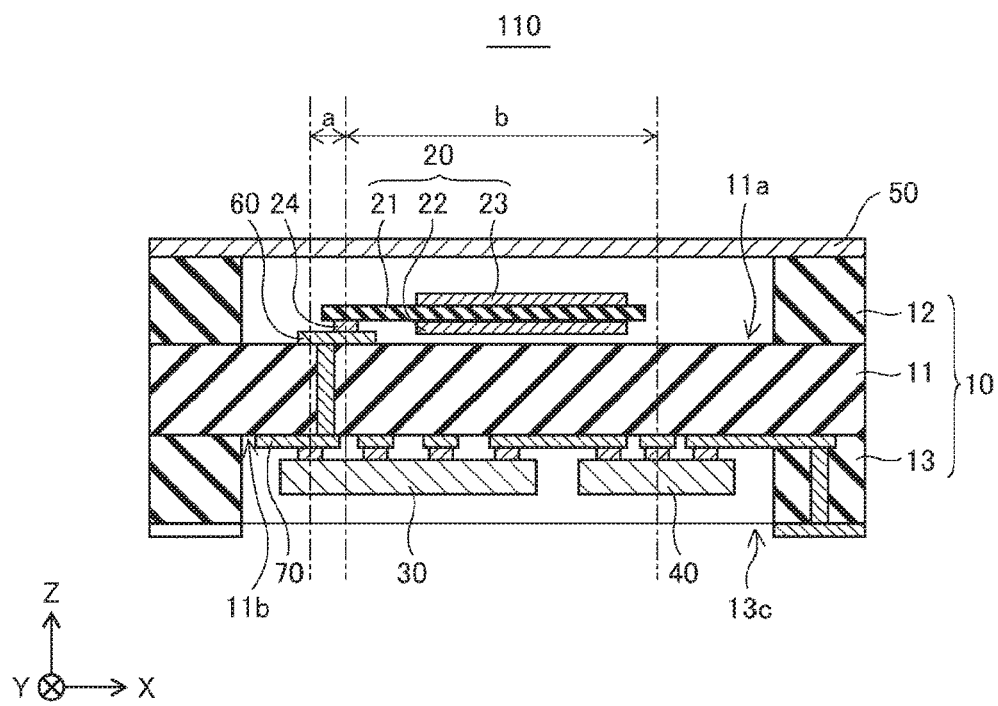
FIG. 1 is a cross-sectional view of a quartz crystal oscillator according to a first embodiment of the invention.

FIG. 1 is a cross-sectional view of the quartz crystal oscillator according to the first embodiment of the invention. As shown in FIG. 1, the quartz crystal oscillator 110 includes a package 10, a quartz crystal resonator 20 mounted in a cavity formed on one surface of the package 10, and at least one semiconductor device (IC) mounted in a cavity formed on the other surface of the package 10. In the present embodiment, as an example, two semiconductor devices 30, 40 are used. Further, the quartz crystal oscillator 110 includes a lid part 50 for covering the quartz crystal resonator 20.

The package 10 has a configuration in which, for example, a second substrate 12 and a third substrate 13 constituting sidewalls are stacked on both surfaces of a first substrate 11, and has an H-shaped cross-section. The first substrate 11, the second substrate 12, and the third substrate 13 are each formed of an insulating material such as ceramics. The first substrate 11 has a first surface 11a and a second surface 11b opposed to each other. It should be noted that the first surface 11a and the second surface 11b of the first substrate 11 can be roughly parallel to each other.

The second substrate 12 constitutes a first sidewall projected from the first surface 11a of the first substrate 11 in the peripheral area of the first surface 11a of the first substrate 11. Further, the third substrate 13 constitutes a second sidewall projected from the second surface 11b of the first substrate 11 in the peripheral area of the second surface 11b of the first substrate 11. The first substrate 11, and the first and second sidewalls constitute a package 10 having two cavities for respectively housing the quartz crystal resonator 20, and the semiconductor devices 30, 40. Thus, it is possible for the package 10 to safely protect the quartz crystal resonator 20, and the semiconductor devices 30, 40.

On the first surface 11a of the first substrate 11, there is disposed a first wiring layer 60, and on the second surface 11b of the first substrate 11, there is disposed a second wiring layer 70. The first substrate 11 is provided with a plurality of through holes, and the first wiring layer 60 and the second wiring layer 70 are electrically connected to each other via the through holes.

The quartz crystal resonator 20 is disposed on the first surface 11a of the first substrate 11, and has a quartz crystal element 21, which is a piezoelectric material, as a resonator element, a first electrode 22 and a second electrode 23 sandwiching the quartz crystal element 21, and a pair of terminals 24 for connecting these electrodes 22, 23 to the first electrode layer 60. By applying an alternating-current voltage between the electrode 22 and the electrode 23 via the pair of terminals 24, a mechanical vibration of the quartz crystal resonator 20 is excited due to the piezoelectric effect.

Further, the lid part 50 for covering the quartz crystal resonator 20 is bonded to the sidewall (the second substrate 12) disposed on the peripheral area of the first surface 11a of the first substrate 11. The lid part 50 is formed of, for example, iron (Fe), cobalt (Co), nickel (Ni), an alloy of any of these materials, or the like. In the cavity in which the quartz crystal resonator 20 is housed, there can also be encapsulated an inert gas such as helium.

The semiconductor device 30 is disposed on the second surface 11b of the first substrate 11, and is electrically connected to the pair of terminals 24 of the quartz crystal resonator 20 via the wiring layers 70, 60. Thus, the semiconductor device 30 performs an oscillation action to generate an oscillation signal. The semiconductor device 40 is disposed on the second surface 11b of the first substrate 11, and controls the oscillation frequency of the semiconductor device 30. Each of the semiconductor devices 30, 40 can also be a semiconductor chip (a bare chip) not encapsulated in a package. The bare chips are mounted on the second surface 11b of the first substrate 11 using flip-chip bonding or the like.

Figure 2:
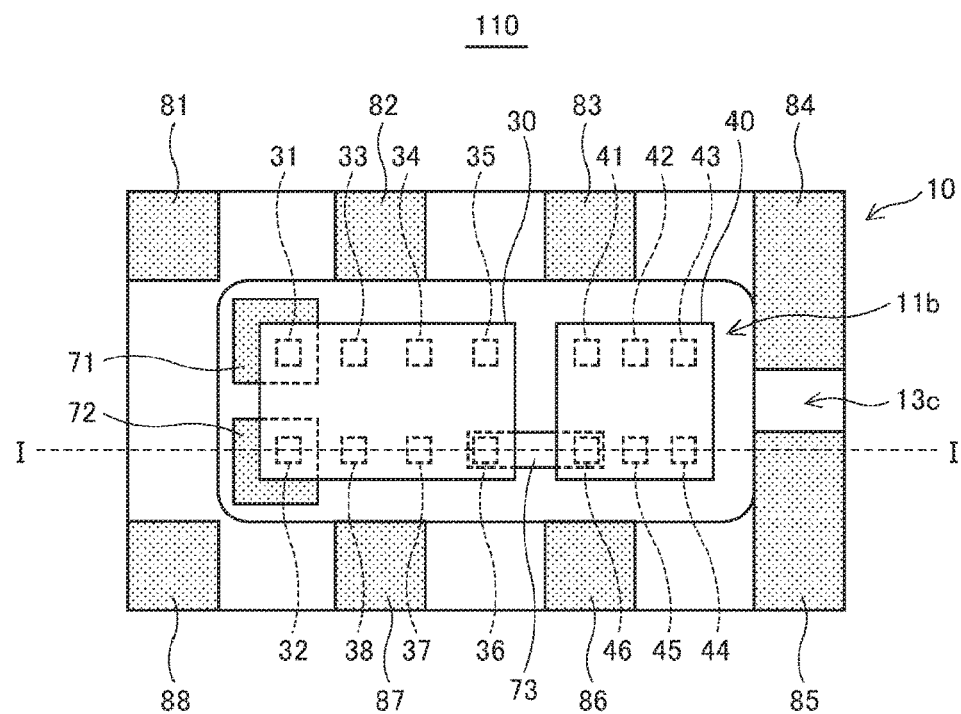
FIG. 2 is a bottom view of the quartz crystal oscillator shown in FIG. 1.

FIG. 2 is a bottom view of the quartz crystal oscillator shown in FIG. 1. The line I-I in FIG. 2 indicates the position of the cross-section shown in FIG. 1. As shown in FIG. 2, on the second surface 11b of the first substrate 11, there are arranged wiring patterns 71 through 73 included in the second wiring layer 70 and other wiring patterns (not shown). A part of each of the wiring patterns constitutes an IC connection pad to be electrically connected to one of the terminals of the semiconductor devices 30, 40.

Further, the wiring patterns 71, 72 are electrically connected respectively to the electrodes 22, 23 via the pair of terminals 24 of the quartz crystal resonator 20. Before mounting the semiconductor devices 30, 40, by trimming the electrode 23 with a laser while making probe needles have contact with the wiring patterns 71, 72 as monitor terminals to measure the resonance characteristic of the quartz crystal resonator 20 using an external device, the resonance frequency of the quartz crystal resonator 20 is adjusted.

Alternatively, there is performed a process of overdriving the quartz crystal resonator 20 to improve the characteristic by making the probe needles have contact with the wiring patterns 71, 72 as the monitor terminals to apply a high alternating-current voltage to the electrodes 22, 23 of the quartz crystal resonator 20. Further, it is also possible to connect the electrodes 22, 23 of the quartz crystal resonator 20 to an external measurement device to check the characteristic of the quartz crystal resonator 20. For example, by measuring the resonance frequency, the impedance, and so on while changing the voltage applied to the electrodes 22, 23 of the quartz crystal resonator 20 from the external measurement device, it is possible to determine whether the quartz crystal resonator 20 is a non-defective product or a defective product based on the magnitude or the variation of the measurement value.

On a surface (a surface shown in FIG. 2) 13c of the second sidewall, there is arranged a plurality of external connection terminals 81 through 88 electrically connected respectively to the plurality of terminals of the semiconductor devices 30, 40. Thus, when mounting the quartz crystal oscillator 110 on the printed-wiring board or the like, electrical connection of the external connection terminals 81 through 88 becomes easy.

The first wiring layer 60, the second wiring layer 70, and the external connection terminals 81 through 88 are each formed of an electrically-conductive material such as aluminum (Al) or copper (Cu). Further, a plurality of through holes is filled with an electrically-conductive material such as aluminum (Al), copper (Cu), or tungsten (W).

For example, the external connection terminals 81, 88 are respectively supplied with a power supply potential VCC and a reference potential VEE. The external connection terminals 82, 83 are used for respectively outputting an inverted clock signal and a clock signal generated based on the oscillation signal. It should be noted that the clock signals are not required to be differential signals, and in that case, the number of external connection terminals for outputting the clock signal can be one.

The external connection terminals 84 through 86 are supplied with digital control signals for controlling the oscillation frequency. It should be noted that it is sufficient for the number of external connection terminals to be supplied with the digital control signals to be equal to or greater than one. The external connection terminal 87 is used for outputting the oscillation signal. In the case in which the clock signal is used instead of the oscillation signal in an external circuit, the external connection terminal 87 can be used for another purpose or can be eliminated.

As an example, the semiconductor device 30 has terminals 31 through 38, and the semiconductor device 40 has terminals 41 through 46. The terminals 31, 32 of the semiconductor device 30 are electrically connected respectively to the pair of terminals 24 of the quartz crystal resonator 20 via the wiring layers 70, 60. The terminals 33, 38 of the semiconductor device 30 are electrically connected respectively to the external connection terminals 81, 88 via a plurality of through holes provided to the third substrate 13. The terminals 34, 35, and 37 of the semiconductor device 30 are electrically connected respectively to the external connection terminals 82, 83, and 87 via the plurality of through holes provided to the third substrate 13.

The terminal 36 of the semiconductor device 30 is electrically connected to the terminal 46 of the semiconductor device 40 via a wiring pattern 73. Thus, the control voltage output from the terminal 46 of the semiconductor device 40 is supplied to the terminal 36 of the semiconductor device 30. The terminals 41, 42 of the semiconductor device 40 are electrically connected respectively to the external connection terminals 81, 88 via the plurality of through holes provided to the third substrate 13. The terminals 43 through 45 of the semiconductor device 40 are electrically connected respectively to the external connection terminals 84 through 86 via the plurality of through holes provided to the third substrate 13.

In the present embodiment, since the quartz crystal resonator 20 and the semiconductor devices 30, 40 are respectively disposed on the both surfaces of the first substrate 11, the distance between each of the terminals 31, 32 of the semiconductor device 30 to be electrically connected respectively to the pair of terminals 24 of the quartz crystal resonator 20 and the pair of terminals 24 of the quartz crystal resonator 20 is made smaller than the distance between each of the terminals 43 through 45 of the semiconductor device 40 supplied with the digital control signals for controlling the oscillation frequency and the pair of terminals 24 of the quartz crystal resonator 20.

For example, as shown in FIG. 1, assuming that the distance in the X-axis direction between the center position of the terminal 32 of the semiconductor device 30 and the center position of the pair of terminals 24 of the quartz crystal resonator 20 is "a," and the distance in the X-axis direction between the center position of the terminal 45 of the semiconductor device 40 and the center position of the pair of terminals 24 of the quartz crystal resonator 20 is "b," a<b becomes true. Further, a<b/4 is desirably fulfilled. Here, the X-axis direction corresponds to the longitudinal direction of the first substrate 11.

According to the first embodiment of the invention, by disposing the quartz crystal resonator 20 and the semiconductor devices 30, 40 respectively on the both surfaces of the first substrate 11, and connecting the quartz crystal resonator 20 and the semiconductor devices 30, 40 to each other via the through holes, it is possible to shorten the interconnections for respectively connecting the pair of terminals 24 of the quartz crystal resonator 20 and the terminals 31, 32 of the semiconductor device 30 to each other to thereby reduce the parasitic capacitance of each of these interconnections. As a result, it is possible to provide the quartz crystal oscillator 110 in which the influence of the exogenous noise such as a noise from a digital circuit on the oscillation action is reduced without narrowing the variable range of the oscillation frequency.

Further, in the example shown in FIG. 1 and FIG. 2, the distance between the terminal 36 supplied with the control voltage for controlling the oscillation frequency and the pair of terminals 24 of the quartz crystal resonator 20 is made shorter than the distance between each of the terminals 43 through 45 supplied with the digital control signals and the pair of terminals 24 of the quartz crystal resonator 20. Thus, since the terminal 36 supplied with the control voltage is disposed closer to the oscillation circuit than the terminals 43 through 45 supplied with the digital control signals, it is possible to reduce the influence of the digital control signals acting as the noise on the oscillation action.

Further, in the example shown in FIG. 1 and FIG. 2, the distance between each of the terminals 34, 35, and 37 for outputting the oscillation signal or the clock signals and the pair of terminals 24 of the quartz crystal resonator 20 is made shorter than the distance between each of the terminals 43 through 45 supplied with the digital control signals and the pair of terminals 24 of the quartz crystal resonator 20. Thus, since the terminals 34, 35, and 37 for outputting the oscillation signal or the clock signals are disposed closer to the oscillation circuit than the terminals 43 through 45 supplied with the digital control signals, it is possible to reduce the influence of the digital control signals acting as the noise on the oscillation action.

Configuration of PLL Circuit

Figure 3:
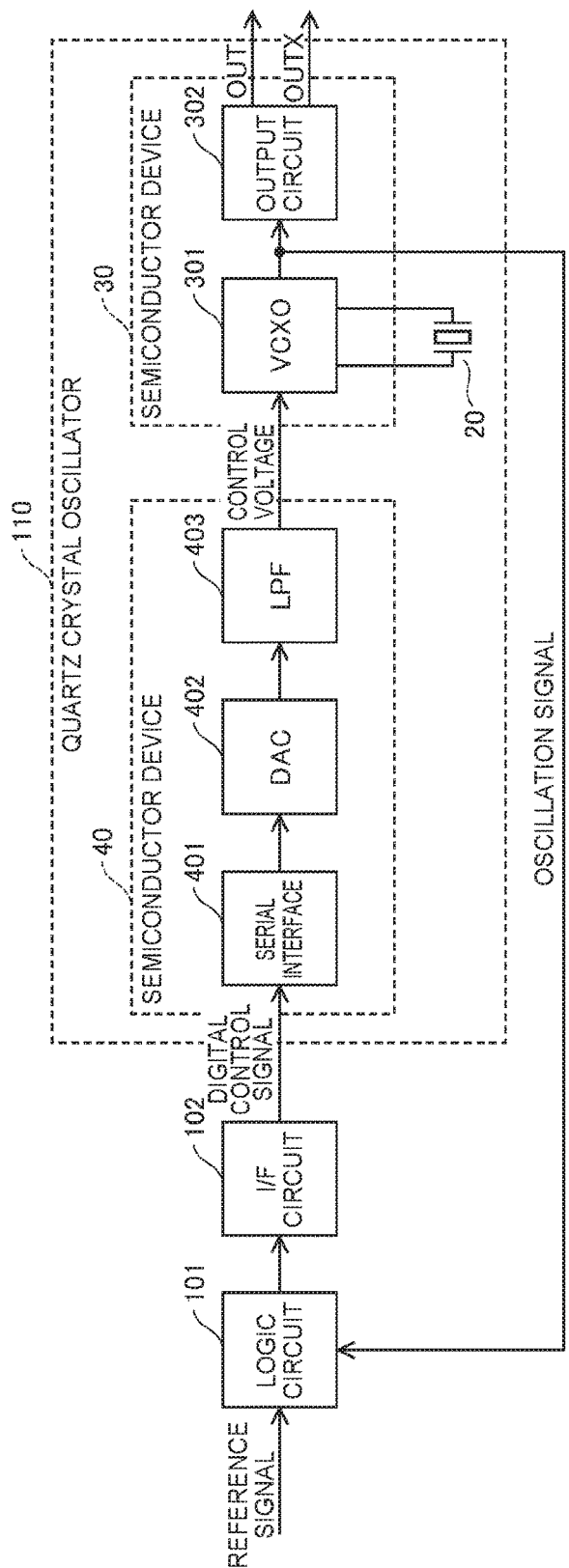
FIG. 3 is a configuration example of a PLL circuit using the quartz crystal oscillator according to the first embodiment.

FIG. 3 is a block diagram showing a configuration example of an PLL circuit using the quartz crystal oscillator according to the first embodiment of the invention. As shown in FIG. 3, the PLL circuit includes a logic circuit 101, an interface (I/F) circuit 102, and the quartz crystal oscillator 110.

The quartz crystal oscillator 110 includes a serial interface (I/F) 401, a digital-to-analog converter (DAC) 402, a low-pass filter (LPF) 403, a voltage-controlled quartz crystal oscillator (VCXO) 301, and an output circuit 302. Here, the serial interface 401 through the LPF 403 are incorporated in the semiconductor device 40, and the VCXO 301 and the output circuit 302 are incorporated in the semiconductor device 30.

Figure 4:
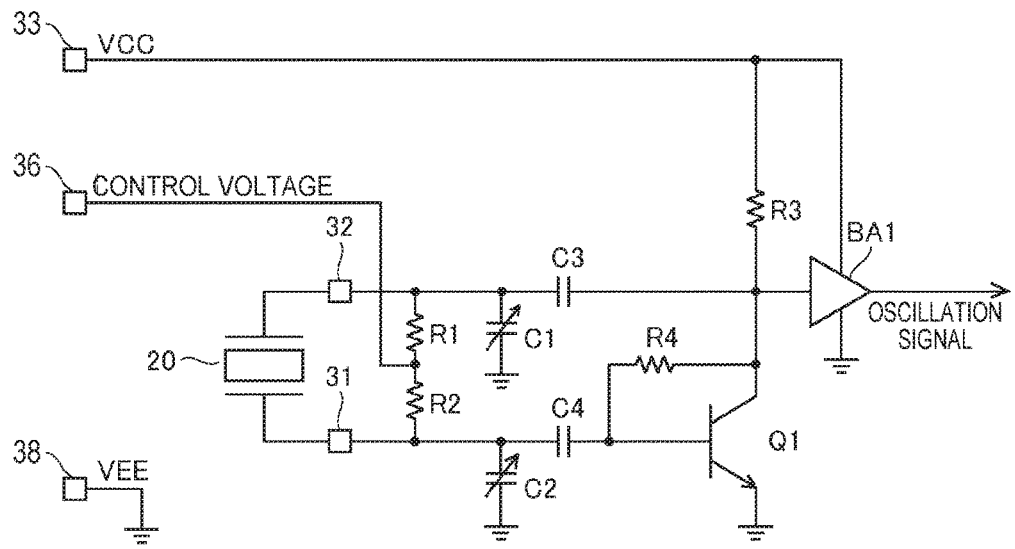
FIG. 4 is a circuit diagram showing a configuration example of a VCXO shown in FIG. 3.

FIG. 4 is a circuit diagram showing a configuration example of the VCXO shown in FIG. 3. As shown in FIG. 4, the VCXO 301 includes an NPN bipolar transistor Q1, capacitors C1 through C4, resistors R1 through R4, and a buffer amplifier BA1. Between the terminal 31 and the terminal 32, there is connected the quartz crystal resonator 20.

The terminal 33 is supplied with the power supply potential VCC, and the terminal 38 is supplied with the reference potential VEE. The resistor R1 and the resistor R2 are connected in series between the two electrodes of the quartz crystal resonator 20. The capacitor C1 and the capacitor C2 are respectively connected between the two electrodes of the quartz crystal resonator 20 and an interconnection of the reference potential VEE. The capacitor C3 is connected between one of the electrodes of the quartz crystal resonator 20 and the collector of the transistor Q1. The capacitor C4 is connected between the other of the electrodes of the quartz crystal resonator 20 and the base of the transistor Q1.

The collector of the transistor Q1 is connected to an interconnection of the power supply potential VCC via the resistor R3, and the emitter is connected to the interconnection of the reference potential VEE. The resistor R4 is connected between the collector and the base of the transistor Q1. The buffer amplifier BA1 buffers the oscillation signal generated in the collector of the transistor Q1 to supply the logic circuit 101 and the output circuit 302 shown in FIG. 3. The output circuit 302 generates the clock signal OUT and the inverted clock signal OUTX conforming to the LVPECL (low-voltage positive emitter-coupled logic) standard based on the oscillation signal and then outputs these signals to an external circuit, for example.

The transistor Q1 performs an inverting amplification operation, and the oscillation signal generated in the collector is fed back to the base via the quartz crystal resonator 20 and so on. On this occasion, the quartz crystal resonator 20 vibrates due to the alternating-current voltage applied by the transistor Q1. The vibration is significantly excited at the natural resonance frequency, and the quartz crystal resonator 20 acts as a negative resistance. As a result, the VCXO 301 oscillates at an oscillation frequency determined mainly by the resonance frequency of the quartz crystal resonator 20.

It should be noted that the oscillation frequency of the VCXO 301 can be fine-tuned by changing the capacitance value of the capacitor C1 or the capacitor C2. Therefore, in the example shown in FIG. 4, the capacitors C1, C2 are each constituted by a variable-capacitance diode (varactor diode) with the capacitance value varying in accordance with the control voltage supplied to the terminal 36, for example. The variable-capacitance diode changes the capacitance value in accordance with a reverse bias voltage applied between the cathode and the anode.

Referring again to FIG. 3, the logic circuit 101 compares the phase or the frequency of the oscillation signal supplied from the VCXO 301 with the phase or the frequency of the reference signal to thereby generate an error signal, and then outputs the error signal to the interface circuit 102. The interface circuit 102 generates the digital control signals for controlling the oscillation frequency of the VCXO 301 based on the error signal output by the logic circuit 101. In the serial transmission of the digital control signals, the SPI standard, the I$^2$C standard, or the like can be used.

For example, it is possible for the interface circuit 102 to generate a serial clock signal for performing the serial transmission, serial control data for adjusting the oscillation frequency, and a chip-select signal for selecting the semiconductor device (chip). The interface circuit 102 outputs these digital control signals to the serial interface 401 incorporated in the semiconductor device 40. The serial clock signal and the control data to be noise sources are output respectively to the terminals 44, 45 shown in FIG. 2.

The serial interface 401 receives the digital control signals output from the interface circuit 102, and then supplies the DAC 402 with the control data. The DAC 402 converts the control data supplied by the serial interface 401 into a control voltage. The LPF 403 performs a low-pass filter process on the control voltage output from the DAC 402. The control voltage output from the LPF 403 is supplied to the VCXO 301 via the terminal 36 shown in FIG. 2. Thus, the oscillation frequency of the VCXO 301 can be controlled from the outside.

Figure 5:
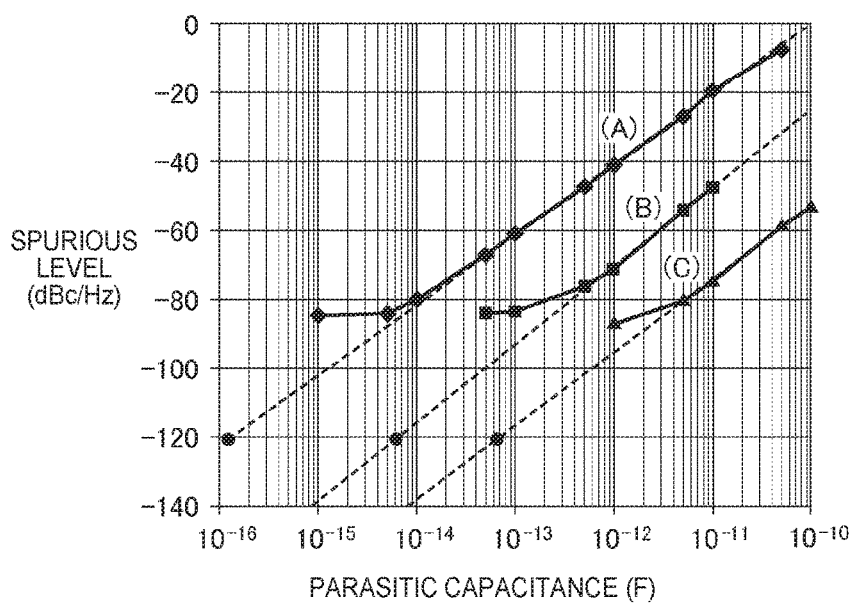
FIG. 5 is a diagram showing a relationship between the parasitic capacitance between a plurality of terminals and the spurious level.

FIG. 5 is a diagram showing a relationship between the parasitic capacitance between a plurality of terminals and the spurious level in the oscillation signal. In FIG. 5, the horizontal axis represents the parasitic capacitance (F), and the vertical axis represents the spurious level (dBc/Hz) per 1 Hz with respect to the fundamental wave (carrier). The spurious denotes components other than the fundamental wave, which is generated by harmonic waves, subharmonic waves, parasitic vibrations, and so on. Further, the solid lines represent measurement values, and include measurement error. On the other hand, the dotted lines represent calculation values.

The (A) part in FIG. 5 shows the relationship between the parasitic capacitance between the terminal 31 of the semiconductor device 30 and the terminal 45 of the semiconductor device 40 shown in FIG. 2, and the spurious level. According to the calculation value, in order to obtain the spurious level of −120 dBc/Hz, it is necessary to set the parasitic capacitance between the terminals to $1.14 \times 10^{-16}$ F.

The (B) part in FIG. 5 shows the relationship between the parasitic capacitance between the terminal 32 of the semiconductor device 30 and the terminal 45 of the semiconductor device 40 shown in FIG. 2, and the spurious level. According to the calculation value, in order to obtain the spurious level of −120 dBc/Hz, it is necessary to set the parasitic capacitance between the terminals to $6.05 \times 10^{-15}$ F.

The (C) part in FIG. 5 shows the relationship between the parasitic capacitance between the terminal 36 of the semiconductor device 30 and the terminal 45 of the semiconductor device 40 shown in FIG. 2, and the spurious level. According to the calculation value, in order to obtain the spurious level of −120 dBc/Hz, it is necessary to set the parasitic capacitance between the terminals to $6.28 \times 10^{-14}$ F.

In general, the power Pb of the noise of the digital signal to be mixed in the fundamental wave is expressed as Formula (1) below defining the voltage of the digital signal as Vd, the parasitic capacitance between the noise source and the noise receiver as Cd, and the capacitance between the noise receiver and the interconnection of the reference potential as Cg.

$$Pd = QV = Cd^3 \cdot Cg/(Cd+Cg)^3 \cdot Vd^2 \quad (1)$$

Here, the voltage Vd of the digital signal is determined by the electronic apparatus used, and the capacitance Cg of the noise receiver affects the variable range of the oscillation frequency. Therefore, the voltage Vd of the digital signal and the capacitance Cg of the noise receiver cannot be changed. Therefore, the influence of the noise is not reduced unless the parasitic capacitance Cd is reduced.

Meanwhile, the power Pa of the analog noise input to a control voltage input terminal of the VCXO is expressed as Formula (2) below defining the voltage of the analog noise as Va.

$$Pa = (Cd+Cg) \cdot Va^2 \quad (2)$$

In the oscillator performing the digital control, it is desired that the digital noise is made sufficiently smaller than the analog noise to thereby obtain the noise characteristic equivalent to that of the oscillator performing the analog control. Therefore, the value of the parasitic capacitance Cd for fulfilling the condition of Pd<Pa is calculated with Formula (1) and Formula (2) as follows.

For example, substituting a typical insertion capacitance of 10 pF for Cg, the same voltage as the power supply voltage of 3.3 V for Vd, and a typical noise level of 60 $nV/Hz^{1/2}$ for Va, the parasitic capacitance Cd for fulfilling the condition of Pd<Pa is calculated from Formula (1) and Formula (2) as 0.069 aF (atto-Farad; $10^{-18}$ F) or smaller. The value corresponds to about one 150-thousandth of the capacitance Cg of the noise receiver.

The parasitic capacitance Cd is expressed as Formula (3) below.

$$Cd = \varepsilon 0 \cdot \varepsilon r \cdot S/r \quad (3)$$

Here, ε0 denotes the electric constant, εr denotes the specific permittivity of an insulating material, S denotes the area of the opposing part between the noise source pattern and the noise receiver pattern extending side by side, and r denotes the distance between the noise source pattern and the noise receiver pattern.

In order to reduce the parasitic capacitance Cd, it is sufficient to decrease the opposing area S between the two patterns or increase the distance r between the two patterns. Since there are restrictions in the manufacturing process on the reduction of the pattern width, to shorten the pattern length is the soundest way to decrease the opposing area S between the two patterns.

Therefore, the present embodiment has a central feature that the quartz crystal resonator 20 and the semiconductor devices 30, 40 are disposed respectively on the both surfaces of the first substrate 11 to be connected to each other via the through holes to thereby shorten the wiring patterns connected to the terminals 31, 32 (FIG. 2) the highest in noise sensitivity, and thus the condition of Pd<Pa described above is achieved.

Second Embodiment

Figure 6:
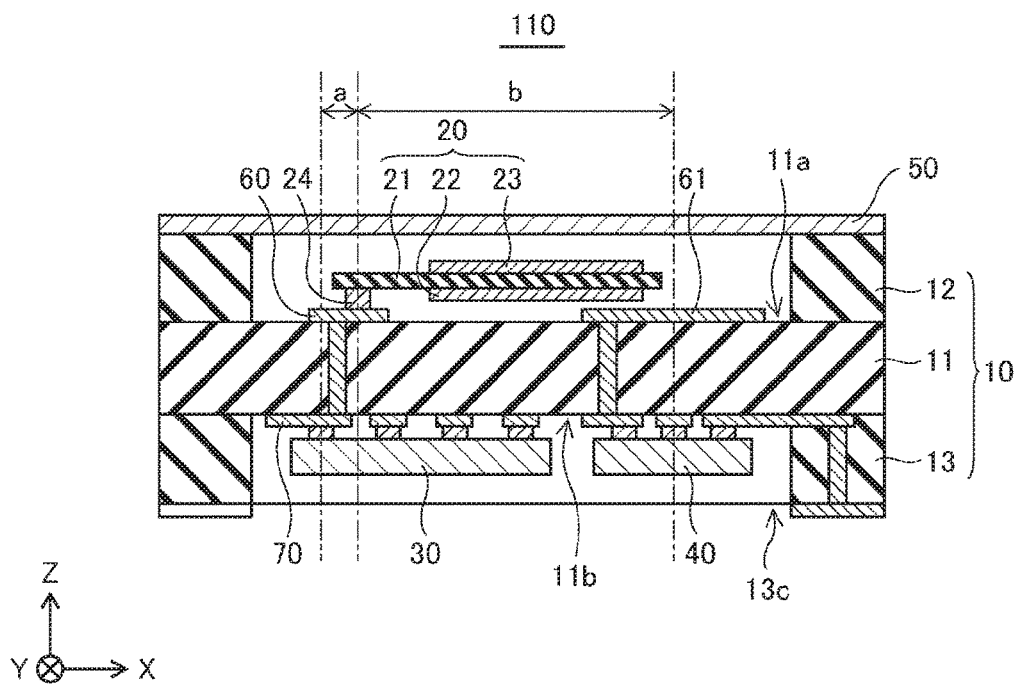
FIG. 6 is a cross-sectional view of a quartz crystal oscillator according to a second embodiment of the invention.

FIG. 6 is a cross-sectional view of a quartz crystal oscillator according to the second embodiment of the invention. In the second embodiment, on the first surface 11a of the first substrate 11, there is disposed a shield pattern 61 electrically connected to the terminal supplied with the power supply potential VCC or the terminal supplied with the reference potential VEE in the semiconductor device 30 or the semiconductor device 40. Regarding other points, the second embodiment can be the same as the first embodiment.

Figure 7:
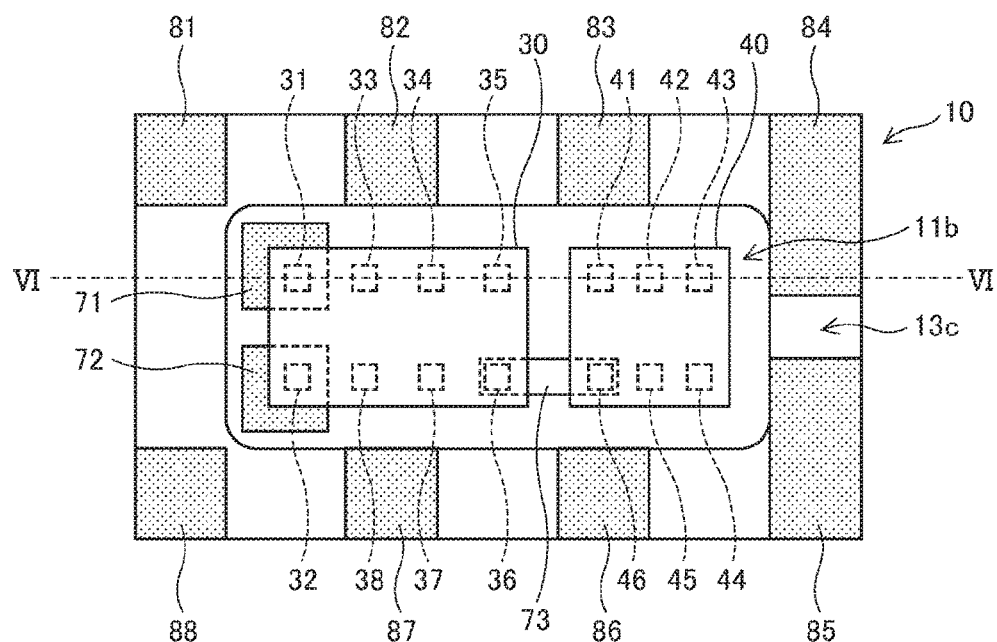
FIG. 7 is a bottom view of the quartz crystal oscillator shown in FIG. 6.

FIG. 7 is a bottom view of the quartz crystal oscillator shown in FIG. 6. The line VI-VI in FIG. 7 indicates the position of the cross-section shown in FIG. 6. In this example, the shield pattern 61 is electrically connected to the terminal 41, which is supplied with the power supply potential VCC by the external connection terminal 81, via the through hole provided to the first substrate 11.

The shield pattern 61 is formed of, for example, a similar material to the material of the wiring layer 60, and can also be disposed in a larger area than the semiconductor device 40 in a planar view. Further, by forming the through hole elongated in the Y-axis direction in the drawing, the electrically-conductive material filling in the through hole also functions as a shield material. In such a case, since the shield effect with respect to the electromagnetic induction in the Z-axis direction and the X-axis direction can be obtained, it is possible to protect the quartz crystal resonator 20 and the terminals 31, 32 of the semiconductor device 30 from the electromagnetic induction.

Third Embodiment

Figure 8:
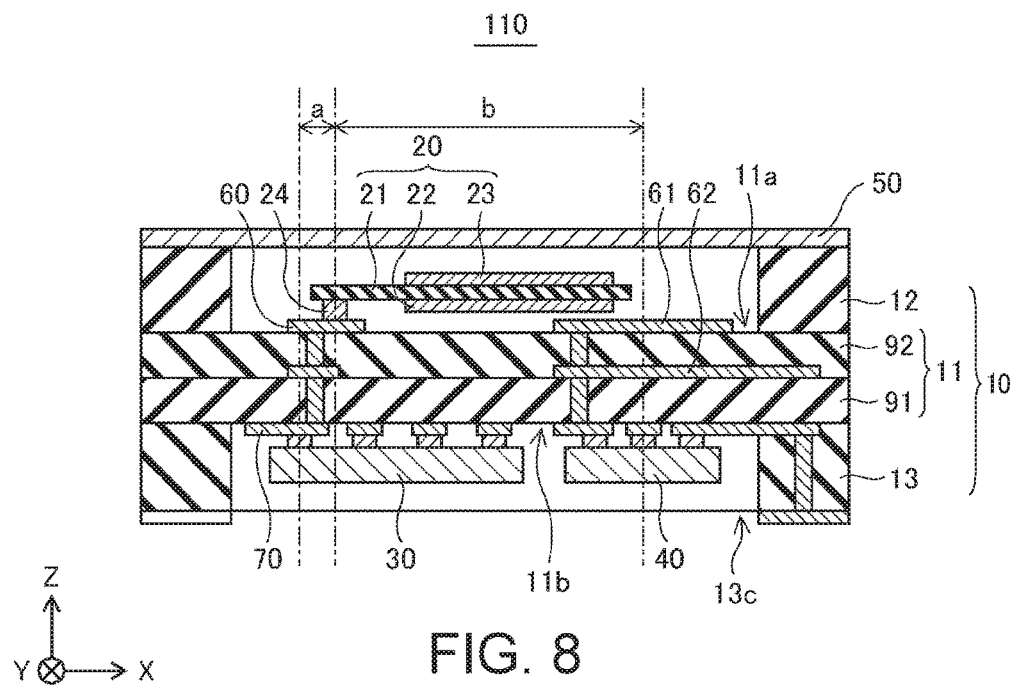
FIG. 8 is a cross-sectional view of a quartz crystal oscillator according to a third embodiment of the invention.

FIG. 8 is a cross-sectional view of a quartz crystal oscillator according to the third embodiment of the invention. In the third embodiment, inside the first substrate 11, there is disposed a shield pattern 62 electrically connected to the terminal supplied with the power supply potential VCC or the terminal supplied with the reference potential VEE in the semiconductor device 30 or the semiconductor device 40. Regarding other points, the third embodiment can be the same as the first embodiment or the second embodiment.

The first substrate 11 is configured by stacking a substrate 91 and a substrate 92 on one another, and the shield pattern 62 is disposed on an upper surface in the drawing of the substrate 91 or on a lower surface in the drawing of the substrate 92. In this example, the shield pattern 62 is electrically connected to the terminal 41 (see FIG. 7), which is supplied with the power supply potential VCC by the external connection terminal 81, via the through hole provided to the substrate 91.

The shield pattern 62 is formed of, for example, a similar material to the material of the wiring layer 60, and can also be disposed in a larger area than the semiconductor device 40 in the planar view. Further, the shield pattern 61 can also be disposed on the upper surface in the drawing of the substrate 92. The shield pattern 61 is electrically connected to the shield pattern 62 via a through hole provided to the substrate 92.

According to the second or the third embodiment of the invention, since the shield pattern 61 or the shield pattern 62 is disposed between the quartz crystal resonator 20 and the semiconductor device 40, there can be obtain an advantage that the influence of the exogenous noise such as a noise from the digital circuit on the oscillation action can further be reduced in addition to the advantages in the first embodiment.

Electronic Apparatus

Then, an electronic apparatus using the quartz crystal oscillator according to any of the embodiments of the invention will be described.

Figure 9:
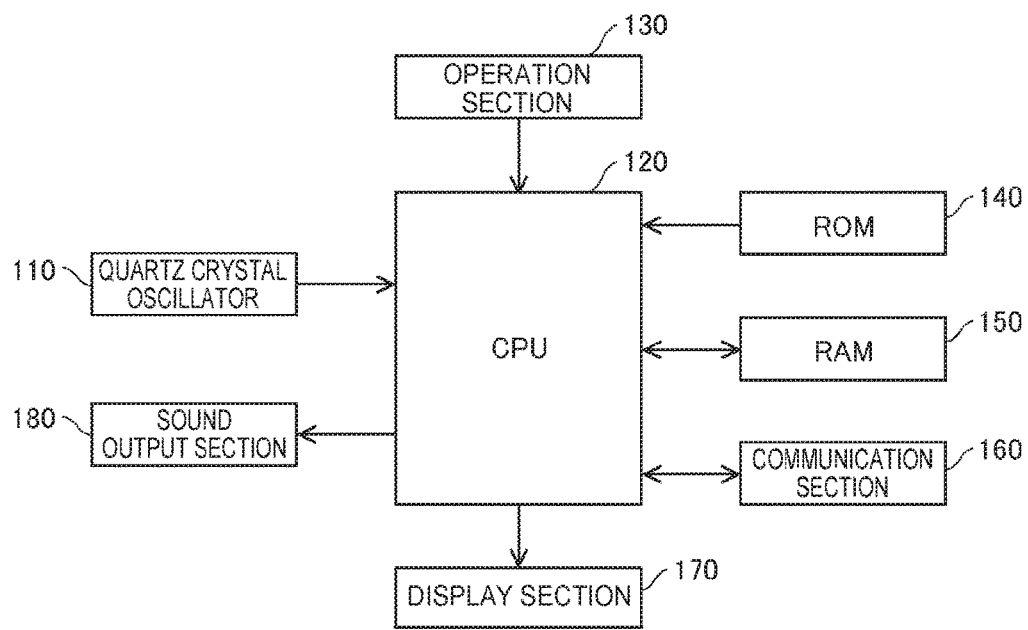
FIG. 9 is a block diagram showing a first configuration example of an electronic apparatus according to an embodiment of the invention.

FIG. 9 is a block diagram showing a first configuration example of the electronic apparatus according to an embodiment of the invention. The electronic apparatus includes the quartz crystal oscillator 110 according to any one of the embodiments of the invention, a CPU 120, an operation section 130, a read-only memory (ROM) 140, a random-access memory (RAM) 150, a communication section 160, a display section 170, and a sound output section 180. It should be noted that it is also possible to eliminate or modify some of the constituents shown in FIG. 9 or to add other constituents to the constituents shown in FIG. 9.

The quartz crystal oscillator 110 performs the oscillation action at the oscillation frequency controlled by the digital control signals to thereby generate the clock signal. The clock signal generated by the quartz crystal oscillator 110 is supplied to each section of the electronic apparatus via the CPU 120 or the like.

The CPU 120 operates in sync with the clock signal supplied from the quartz crystal oscillator 110, and performs a variety of signal processing and control processing in accordance with programs stored in the ROM 140 and so on. For example, the CPU 120 performs a variety of signal processing in accordance with the operation signal supplied from the operation section 130, and controls the communication section 160 for performing data communication with the outside. Alternatively, the CPU 120 generates an image signal for making the display section 170 display a variety of images, and generates a sound signal for making the sound output section 180 output a variety of sounds.

The operation section 130 is an input device including, for example, operation keys, button switches, and outputs the operation signal corresponding to the operation by the user to the CPU 120. The ROM 140 stores the programs, data, and so on for the CPU 120 to perform the variety of types of signal processing and control processing. The RAM 150 is used as a working area of the CPU 120, and temporarily stores the program and data retrieved from the ROM 140, the data input using the operation section 130, the calculation result obtained by the CPU 120 performing operations in accordance with the programs, or the like.

The communication section 160 is constituted by, for example, an analog circuit and a digital circuit, and performs the data communication between the CPU 120 and the external devices. The display section 170 includes, for example, a liquid crystal display device (LCD), and displays a variety of information based on the image signal supplied by the CPU 120. Further the sound output section 180 includes, for example, a speaker, and outputs a sound based on the sound signal supplied by the CPU 120.

As the electronic apparatus described above, there are cited, for example, a mobile terminal such as a cellular phone, a smart card, an electric calculator, an electronic dictionary, a computerized game machine, a digital still camera, a digital movie, a television set, a video phone, a security video monitor, a head-mounted display, a personal computer, a printer, network equipment, a car navigation system, measurement equipment, and medical equipment (e.g., an electronic thermometer, an electronic manometer, an electronic blood sugar meter, an electrocardiogram measurement instrument, an ultrasonograph, and an electronic endoscope).

Figure 10:
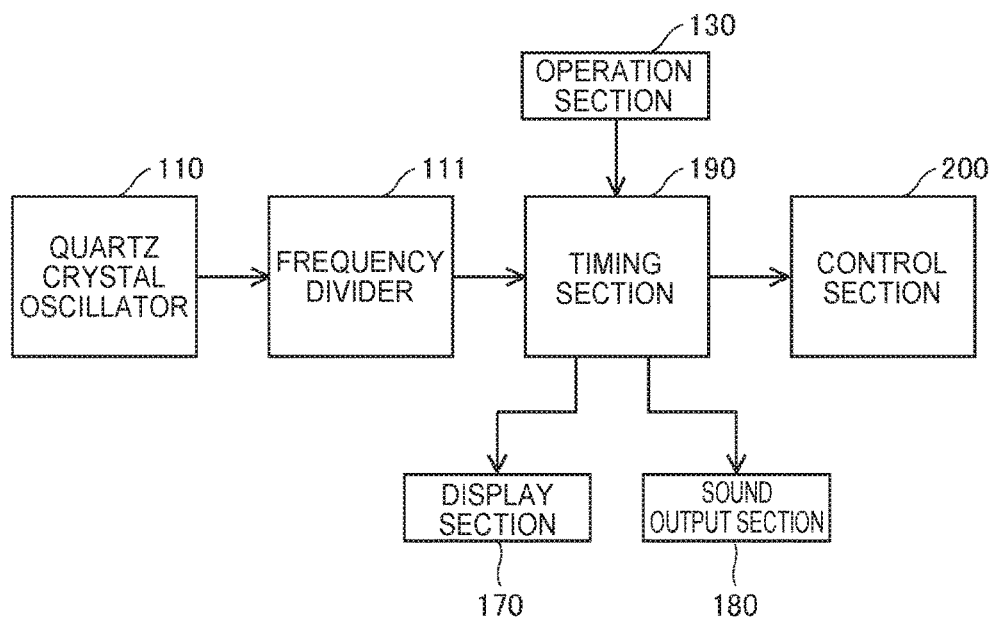
FIG. 10 is a block diagram showing a second configuration example of an electronic apparatus according to an embodiment of the invention.

FIG. 10 is a block diagram showing a second configuration example of the electronic apparatus according to an embodiment of the invention. In this example, a timepiece and a timer will be described. The timepiece according to an embodiment of the invention includes the quartz crystal oscillator 110 according to any one of the embodiments of the invention, a frequency divider 111, the operation section 130, the display section 170, the sound output section 180, and the timing section 190. Further, the timer according to an embodiment of the invention includes a control section 200 instead of the sound output section 180. It should be noted that it is also possible to eliminate or modify some of the constituents shown in FIG. 10 or to add other constituents to the constituents shown in FIG. 10.

The frequency divider 111 is constituted by, for example, a plurality of flip-flops, and divides the frequency of the clock signal supplied from the quartz crystal oscillator 110 to generate a divided clock signal for timing. The timing section 190 is constituted by, for example, a counter, and performs a timing operation based on the divided clock signal supplied from the frequency divider 111 to generate a display signal representing the current time and an alarm time, and an alarm signal for generating an alarm sound.

The operation section 130 is used for setting the current time and the alarm time to the timing section 190. The display section 170 displays the current time and the alarm time in accordance with the display signal supplied from the timing section 190. The sound output section 180 generates the alarm sound in accordance with the alarm signal supplied from the timing section 190.

In the case of the timer, a timer function is provided instead of the alarm function. Specifically, the timing section 190 generates a timer signal representing the fact that the current time has coincided with the preset time. The control section 200 turns ON or OFF the equipment connected to the timer in accordance with the timer signal supplied from the timing section 190.

According to the present embodiment, it is possible to provide the electronic apparatus operating with the accurate clock signal generated using the quartz crystal oscillator 110 in which the influence of the exogenous noise such as a noise from a digital circuit on the oscillation action is reduced without narrowing the variable range of the oscillation frequency.

Moving Object

Then, a moving object using the quartz crystal oscillator according to any of the embodiments of the invention will be described. As the moving object, there can be cited, for example, a vehicle, a self-propelled robot, a self-propelled carrying apparatus, a train, a boat and ship, an airplane, and an artificial satellite.

Figure 11:
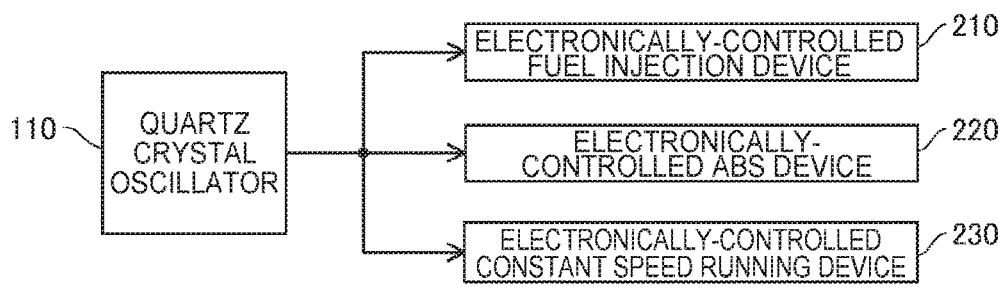
FIG. 11 is a block diagram showing a configuration example of a moving object according to an embodiment of the invention.

FIG. 11 is a block diagram showing a configuration example of a moving object according to an embodiment of the invention. As shown in FIG. 11, the moving object includes the quartz crystal oscillator 110 according to any one of the embodiments of the invention, and is further equipped with electronically-controlled devices such as an electronically-controlled fuel injection device 210, an electronically-controlled ABS device 220, and an electronically-controlled constant speed running device 230. It should be noted that it is also possible to eliminate or modify some of the constituents shown in FIG. 11 or to add other constituents to the constituents shown in FIG. 11.

The quartz crystal oscillator 110 performs the oscillation action at the oscillation frequency controlled by the digital control signals to thereby generate the clock signal. The clock signal generated by the quartz crystal oscillator 110 is supplied to the electronically-controlled fuel injection device 210, the electronically-controlled ABS device 220, the electronically-controlled constant speed running device 230 or the like.

The electronically-controlled fuel injection device 210 operates in sync with the clock signal supplied from the quartz crystal oscillator 110, and sprays the liquid fuel into the intake air in a misty state at a predetermined timing in a premixed combustion engine such as a gasoline engine. The electronically-controlled ABS (antilock braking system) device 220 operates in sync with the clock signal supplied from the quartz crystal oscillator 110, and repeats the operation of driving the brake with the gradually increasing strength, and releasing the brake once when the moving object starts slipping, and then driving the brake again, when the operation is performed so as to put on the brake. The electronically-controlled constant speed running device 230 operates in sync with the clock signal supplied from the quartz crystal oscillator 110, and controls the accelerator and the brake so as to keep the speed of the moving object constant while monitoring the speed of the moving object.

According to the present embodiment, it is possible to provide the moving object operating with the accurate clock signal generated using the quartz crystal oscillator 110 in which the influence of the exogenous noise such as a noise from a digital circuit on the oscillation action is reduced without narrowing the variable range of the oscillation frequency.

Although in the embodiments described above, the quartz crystal oscillator using the quartz crystal resonator is described, the invention is not limited to the embodiments described hereinabove, but can also be applied to oscillators using piezoelectric materials other than quartz crystal. As described above, it is possible for those skilled in the art to make a number of modifications within the scope or the spirit of the invention.

The entire disclosure of Japanese Patent Application No. 2015-199983, filed Oct. 8, 2015 is expressly incorporated by reference herein.

What is claimed is:

1. An oscillator comprising:
   a substrate having a first surface and a second surface opposed to each other, a first wiring layer and a second wiring layer disposed respectively on the first surface and the second surface, and a plurality of through holes electrically connecting the first wiring layer and the second wiring layer to each other;
   a resonator disposed above the first surface of the substrate, and having a resonator element, a pair of electrodes sandwiching the resonator element, and a pair of terminals adapted to electrically connect the pair of electrodes to the first wiring layer; and
   at least one semiconductor device disposed on the second surface of the substrate, adapted to perform an oscillation action to generate an oscillation signal, and having first and second terminals electrically connected respectively to the pair of terminals of the resonator via the second wiring layer and the first wiring layer, and a third terminal supplied with a digital control signal adapted to control an oscillation frequency,
   wherein a distance between each of the first and second terminals and the pair of terminals of the resonator is shorter than a distance between the third terminal and the pair of terminals of the resonator,
   the at least one semiconductor device further includes a fourth terminal supplied with a power supply potential, and a fifth terminal supplied with a reference potential, and
   the substrate includes a shield pattern electrically connected to one of the fourth and fifth terminals, and disposed on the first surface.

2. The oscillator according to claim 1, wherein
   the at least one semiconductor device further includes a sixth terminal supplied with a control voltage adapted to control the oscillation frequency, and
   a distance between the sixth terminal and the pair of terminals of the resonator is shorter than a distance between the third terminal and the pair of terminals of the resonator.

3. The oscillator according to claim 1, wherein
   the at least one semiconductor device further includes a sixth terminal supplied with a control voltage adapted to control the oscillation frequency, and
   a distance between the sixth terminal and the pair of terminals of the resonator is shorter than a distance between the third terminal and the pair of terminals of the resonator.

4. The oscillator according to claim 1, wherein
   the at least one semiconductor device further includes a seventh terminal adapted to output one of the oscillation signal and a clock signal generated based on the oscillation signal, and a distance between the seventh terminal and the pair of terminals of the resonator is shorter than a distance between the third terminal and the pair of terminals of the resonator.

5. The oscillator according to claim 1, wherein the at least one semiconductor device further includes a seventh terminal adapted to output one of the oscillation signal and a clock signal generated based on the oscillation signal, and a distance between the seventh terminal and the pair of terminals of the resonator is shorter than a distance between the third terminal and the pair of terminals of the resonator.

6. The oscillator according to claim 1, wherein the substrate, a first sidewall projecting from the first surface of the substrate in a peripheral area of the first surface of the substrate, and a second sidewall projecting from the second surface of the substrate in a peripheral area of the second surface of the substrate constitute a package having two cavities respectively housing the resonator and the at least one semiconductor device.

7. The oscillator according to claim 6, further comprising:

a plurality of external connection terminals disposed on a principal surface of the second sidewall, and electrically connected respectively to the terminals of the at least one semiconductor device.

8. An electronic apparatus comprising:

the oscillator according to claim 1.

9. A moving object comprising:

the oscillator according to claim 1.

* * * * *